United States Patent [19]
Koh et al.

[11] Patent Number: 5,627,095
[45] Date of Patent: May 6, 1997

[54] METHOD FOR FABRICATING SEMICONDUCTOR DEVICES HAVING BIT LINES AND STORAGE NODE CONTACTS

[75] Inventors: Yo-Hwan Koh; Chan-Kwang Park; Seong-Min Hwang; Kwang-Myoung Rho, all of Seoul, Rep. of Korea

[73] Assignee: Hyundai Electronics Industries Co., Ltd., Kyoungki-do, Rep. of Korea

[21] Appl. No.: 581,327

[22] Filed: Dec. 29, 1995

[30] Foreign Application Priority Data

Dec. 31, 1994 [KR] Rep. of Korea ............... 40303/1994

[51] Int. Cl.$^6$ .............................. H01L 21/70; H01L 27/00
[52] U.S. Cl. ........................ 438/672; 438/702; 438/396
[58] Field of Search .................... 437/47, 52, 60, 437/919

[56] References Cited

U.S. PATENT DOCUMENTS

| 5,424,235 | 6/1995 | Nishihara | 437/52 |
| 5,470,776 | 11/1995 | Ryou | 437/52 |
| 5,492,851 | 2/1996 | Ryou | 437/52 |

*Primary Examiner*—Jey Tsai
*Attorney, Agent, or Firm*—Ware, Fressola, Van Der Sluys & Adolphson

[57] ABSTRACT

A method of manufacturing a semiconductor device, capable of securing an alignment margin between bit lines and a storage node contact is disclosed herein. The method includes: a depositing step of a first insulating layer on a semiconductor substrate of MOS structure; a forming step of a bit line pattern; a depositing step of a second insulating layer; a depositing step of sequentially a third and fourth insulating layers which have different etch rates; a masking and etching step of said fourth and third insulating layers to form T-shaped patterns in cross-sectional view; a forming step of polysilicon spacers at sidewalls of the T-shaped insulating patterns; a depositing step of a fifth insulating layer; a forming step of first photoresist mask pattern; etching steps of etching a predetermined portion of the fifth insulating layer, etching the T-shaped insulating layer pattern, etching the second insulating layer, etching the bit line pattern and etching the first insulating layer; a forming step of bit line contact; a depositing step of a sixth insulating layer; a forming step of second photoresist mask pattern for forming storage node contact hole on the sixth insulating layer and a forming step of a storage node contact hole by etching the predetermined portions of the sixth and fifth insulating layers, the T-shaped pattern, and the second and first insulating layer, sequentially.

11 Claims, 10 Drawing Sheets

PRIOR ART

FIG.2(E)

PRIOR ART

FIG.2(F)

PRIOR ART

FIG.2(G)

PRIOR ART

METHOD FOR FABRICATING SEMICONDUCTOR DEVICES HAVING BIT LINES AND STORAGE NODE CONTACTS

TECHNICAL FIELD

This invention generally relates to a method for fabricating semiconductor devices, and more particularly, to a method for fabricating semiconductor devices capable of securing a process margin between bit lines and a storage node contact using a T-shaped pattern with insulating layers having different etch rates.

BACKGROUND OF THE INVENTION

Generally, the high integration of a Dynamic Random Access Memory (DRAM) has been achieved through the development of semiconductor device fabrication equipment and processing technology, design techniques, memory cell structure, etc.

There have been, however, many problems in developing highly integrated memory devices due to the physically imposed limitations of the semiconductor fabrication equipment and semiconductor device itself.

For example, in order to achieve a highly integrated memory device there should be a decreased area for the storage capacitor. In addition to the above matter, a decrease in area of a Metal Oxide Semiconductor (hereinafter, referred to as "MOS") device should also be followed.

In semiconductor devices with integration greater than the VLSI level, the elements in one MOS device should have the effective channel length within a range of 0.5 μm and should secure a predetermined interval between the conductors because of the narrowed interval between devices due to the increased integration. The increase in integration is inevitably followed by the problem of the shorting of the conductors, etc.

Especially, in semiconductor device with Ultra Large Scale Integration over 256 Megabit DRAM, technology is needed for forming a contact hole capable of securing an alignment margin for maintaining the insulation of the conductors, because the width between the word lines and the width between the bit lines are as narrow as a minimum line width.

Figure 1:
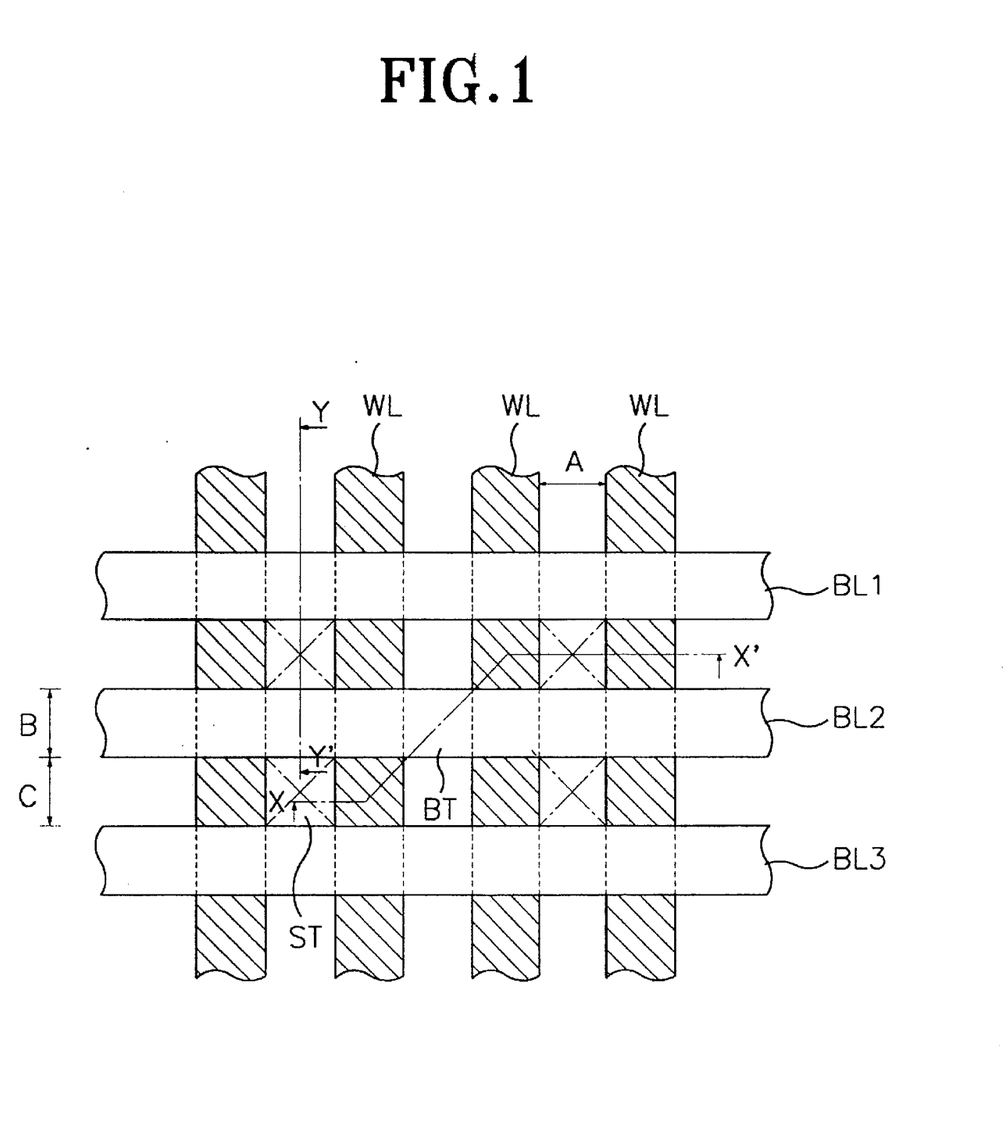
FIG. 1 is a plan view of a common DRAM cell.

The following is a description in detail of a prior art process for forming the contact of the bit line and storage node referring to FIG. 1 and 2.

FIG. 1 is a plan view of a common DRAM. It shows multiple parallel word lines and multiple parallel bit lines orthogonal to the word line. The bit line contact and storage node contact are positioned at the portions of intersection where the bit line intersect with the word lines, and are respectively, electrically connected with the drain and source. As shown in FIG. 1, the bit line contacts are denoted as "BT" and the storage node contacts as "ST".

In addition, the interval between the word lines is denoted as "A", the width of the bit line as "B", and the interval between the bit lines as "C", respectively.

FIG. 2 is a sectional view taken along X–X' line in FIG. 1, which illustrates a method for fabricating a DRAM cell according to the conventional art.

Figure 2A:
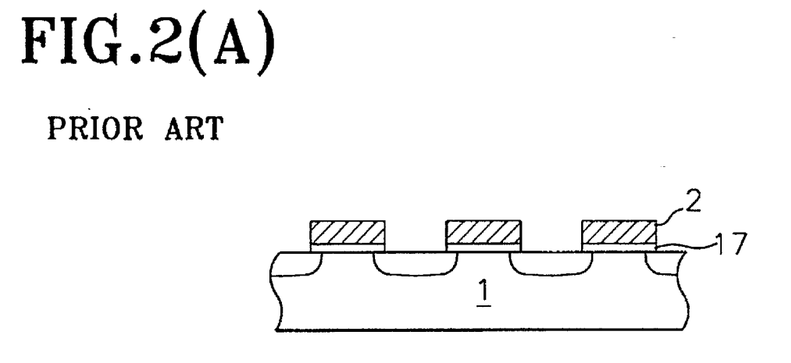
FIGS. 2A–2G are a sectional view taken along X–X' line in FIG. 1, which illustrates a method for fabricating a DRAM cell according to a conventional art.

First referring to FIG. 2A, a silicon dioxide layer 17, approximately 350 Angstroms thick, is thermally grown on a silicon substrate 1.

Typically, the substrate would be a relatively large wafer which after processing would be cut up into a number of chips. Each of the chips would include a VLSI circuit employing a large number of p-channel and n-channel transistors. A polycrystalline silicon (hereinafter, referred to as "polysilicon") layer with a thickness of 4500 Å is formed on the silicon dioxide layer by low pressure chemical vapor deposition (LPCVD).

Predetermined portions of the deposited polysilicon layer and the silicon dioxide layer are selectively removed, using a conventional photolithographic and etching process (the first masking step) to form the gate patterns of 2 and 17 shown in FIG. 2A.

After the process of establishing the gate patterns, p(Boron) and n(Phosphorous or Arsenic) type impurities are implanted into the exposed portions of the substrate with doses sufficient for forming p and n diffusion regions of the source and drain. The implanted impurities are then thermally diffused by a thermal anneal process. Through the above processes, as shown in FIG. 2A, a MOS transistor structure is formed.

In the MOS device, drain and source regions are electrically connected with the bit line or the storage node electrode via contact holes formed at an insulating layer which is to be formed on the MOS structure of FIG. 2A through succeeding process steps. Hereinafter, for the sake of illustration, diffused portions in electrical contact with bit line contact are referred to as "drain" and diffused portions in contact with storage node contact are referred to as "source".

Figure 2B:
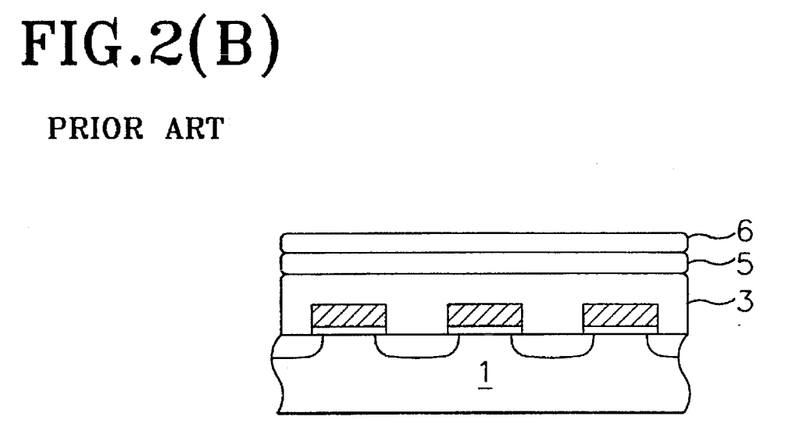

Turning now to FIG. 2B, after the formation of the diffusion layer, the first insulating layer 3 is deposited on the entire surface of the resultant MOS structure. The purpose of the deposition is to deposit an insulating layer 3 with a planar surface and thereby alleviating the height difference between the gate region and the source and the drain region.

Second and third layers 5 and 6, are deposited on the first insulating layer 3 sequentially, in which the etching rate of each layer is sufficiently different from one another. The second layer 5 has a higher etching rate than the third layer 6.

Figure 2C:
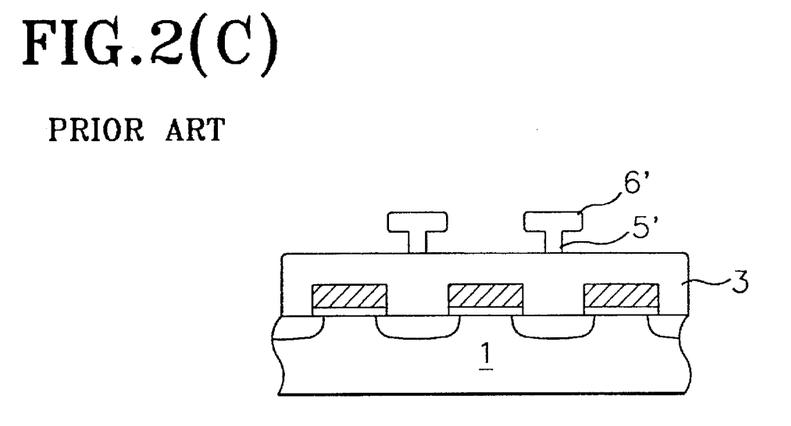
Figure 2D:
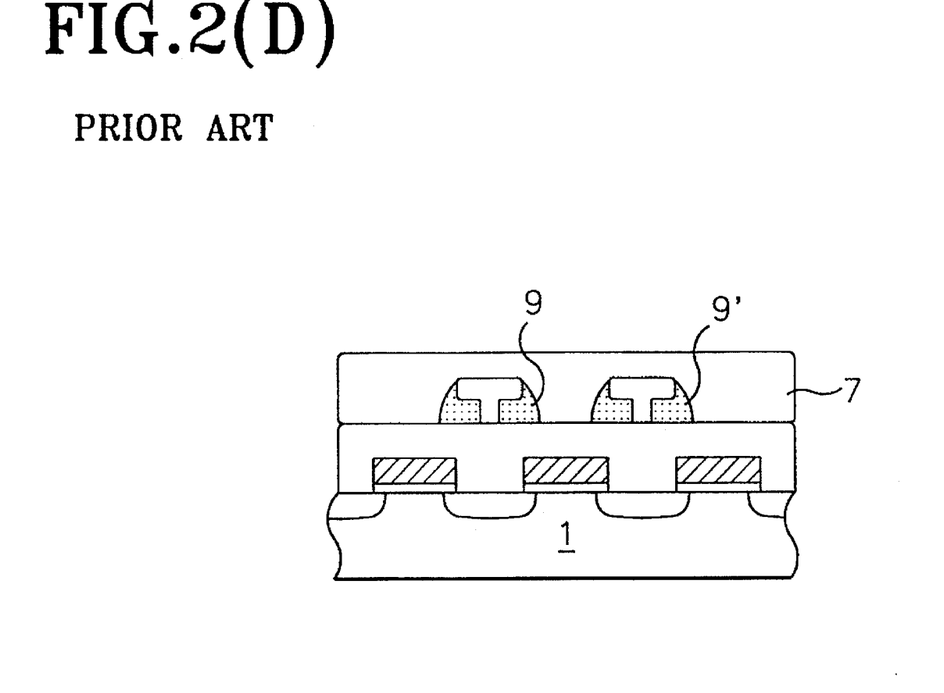

Referring now to FIG. 2C, the second and third insulating layers are selectively etched away by an anisotropic etch using a mask pattern, to define a ring-shaped contact hole due to the difference of the two layers in the etch rate. Hereinafter, we refer the ring-shaped pattern etched by difference in etch rate to as the "T-shaped pattern" for the sake of convenience. In FIG. 2C, a head portion and a leg portion of the T-shaped pattern are denoted as 6' and 5' respectively.

Sidewall polysilicon spacers 9 and 9' are then formed by depositing a polysilicon layer on the T-shaped insulating layer pattern and etching the polysilicon layer anisotropically. On the entire surface of the resultant structure after the formation of the polysilicon pattern, a fourth insulating layer 7 is deposited to form a plane surface resulting in the profile shown in FIG. 2D.

Figure 2E:
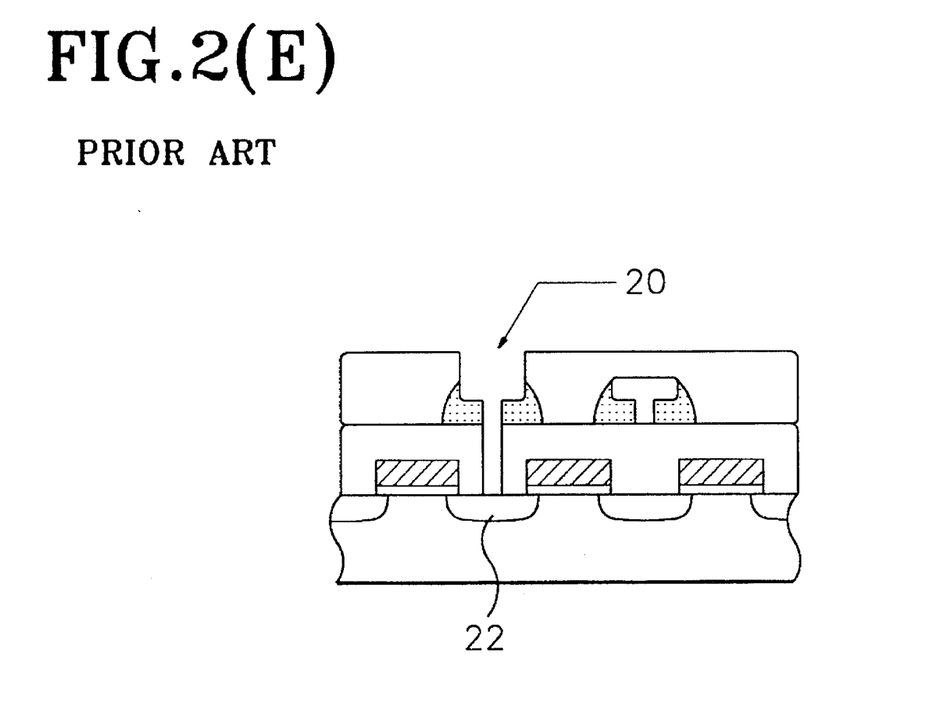

Next, a photoresist mask pattern (not shown in drawings) is formed on the fourth insulating layer 7 exposing a predetermined surface of the fourth insulating layer over the heads of the T-shaped insulating patterns. The predetermined portion of the fourth insulating layer 7 and T-shaped insulating layers are etched away by means of the pattern of the photoresist mask with the inside face pattern of the sidewall polysilicon spacer 9 acting as an etch barrier. And, continuously, a portion of the first insulating layer 3 wherein the leg of the T-shaped insulating layer pattern is downwardly extended, is etched away until the diffusion layer is exposed. A contact hole 20 is formed by the above etch process as shown in FIG. 2E.

Figure 2F:
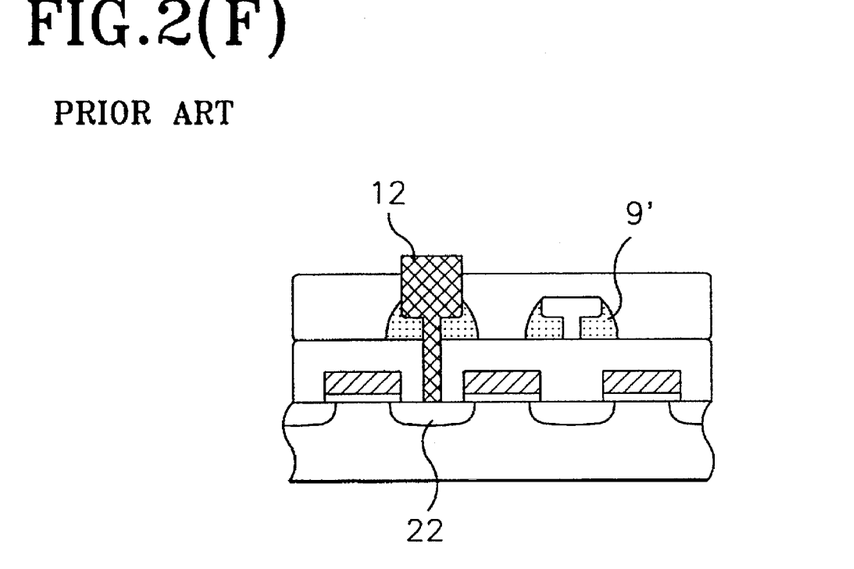

A conductive layer of polysilicon, for example, is then deposited at the entire surface including the contact hole 20 by chemical vapor deposition and patterned to provide a contact 12 of the bit line by extending through the contact hole 20 to the surface of the drain region 22, as shown in FIG. 2F.

After the formation of the contact 12, a fifth insulating layer 10 is deposited on the entire surface of the resultant semiconductor structure. A mask pattern 15 is then formed on the fifth insulating layer 10 to provide a contact hole for a storage node electrode. Using the mask pattern, predetermined portions of the fifth insulating layer 10, the fourth insulating layer 7 and the T-shaped insulating layer (the third and second insulating layer) inside the sidewall polysilicon spacers 9', are etched away anisoptropically. Simultaneously, the portion of the first insulating layer 3 where the leg of the T-shaped insulating layer pattern is downwardly extended, is etched away until the doped source region is exposed. A contact hole 21 is formed by the above etch process as shown in FIG. 2G.

Figure 2G:
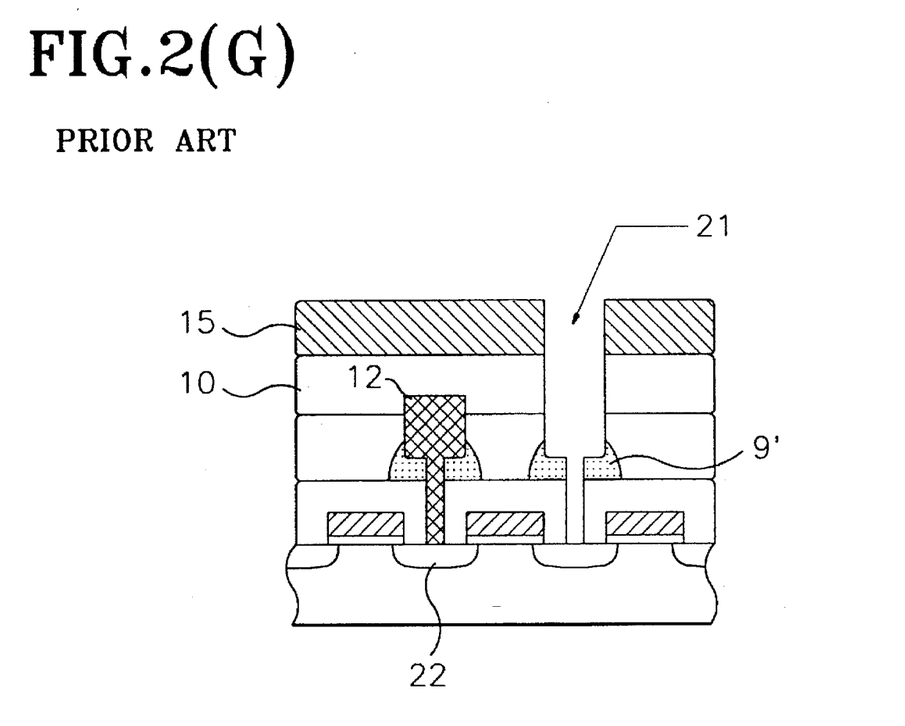
Figure 3:
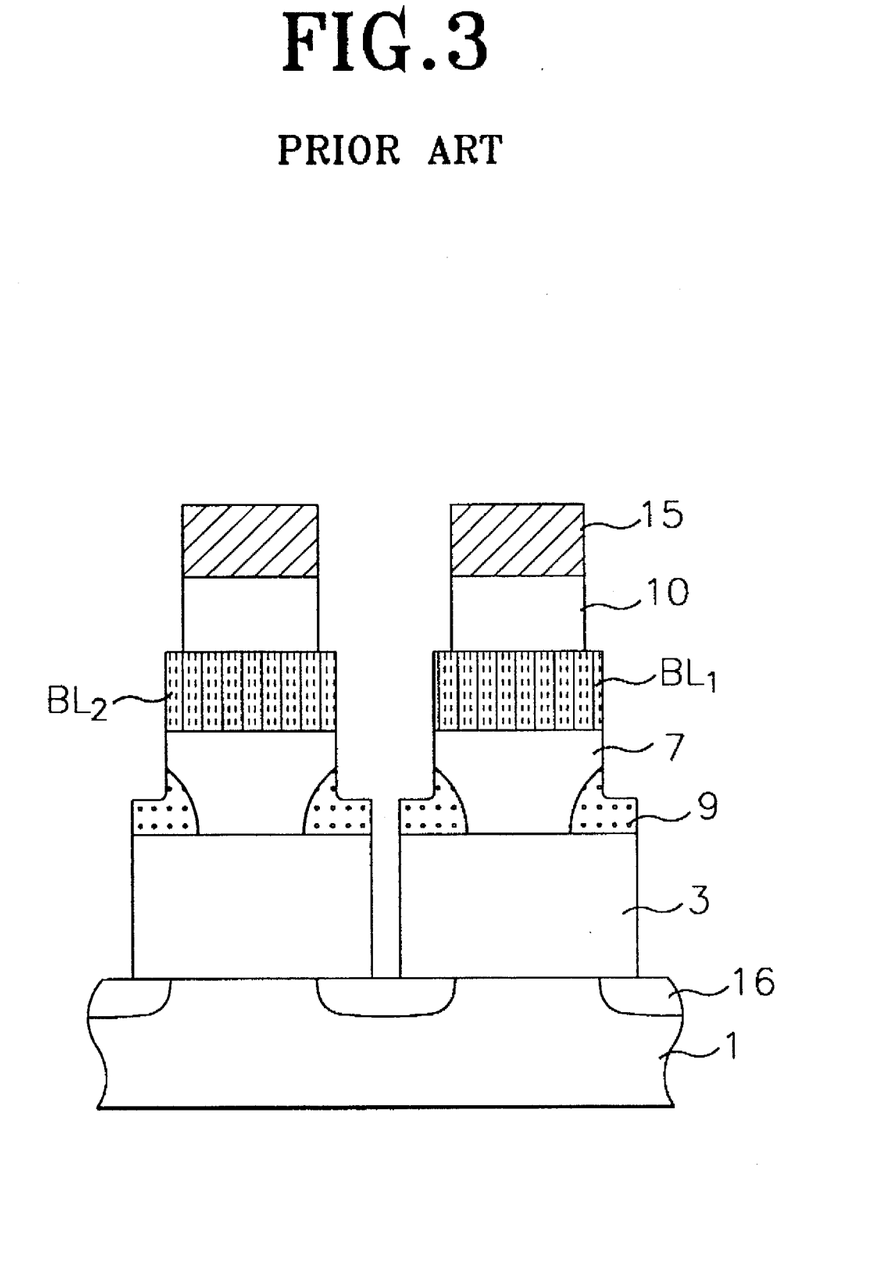
FIG. 3 is a sectional view of DRAM cell according to the conventional art illustrated in FIG. 2 and is sectioned along the Y–Y' line of FIG. 1.

FIG. 3 is a sectional view of DRAM cell according to the conventional art illustrated in FIG. 2 and is sectioned along the Y–Y' line of FIG. 1.

First we can compare FIG. 1 with FIG. 2G in order to grasp a problem in the conventional fabrication process of semiconductor device. In accordance with FIG. 2, it seems that there is no problem at the bit line contact portions and the storage node contact portions sectioned in parallel with the bit lines ($BL_1$, $BL_2$, $BL_3$).

However, by comparing FIG. 1 with FIG. 3, an important problem is shown in the storage node contact portions: the head portion of T-shaped storage node contact is aligned with bit lines $BL_1$ and $BL_2$. The result is that the bit lines $BL_1$ and $BL_2$ are in direct contact with the storage node electrode so that semiconductor device manufactured by conventional process always has a shorting problem.

SUMMARY OF THE INVENTION

Accordingly, it is an object of the present invention to provide a method of manufacturing a semiconductor device which is capable of obtaining an adequate process margin between the bit line and the contact of the storage node so as to prevent the occurrence of the shorting phenomenon between bit lines and which is capable of increasing the integration of the device, the yield, and the degree of design freedom.

In accordance with the present invention, this object can be accomplished by providing a method of manufacturing a semiconductor device comprising of the following steps: depositing a first insulating layer on a semiconductor substrate having active electrodes of source, drain and gate; forming a conductive layer pattern to provide a bit line on said first insulating layer; depositing a second insulating layer that completely covers said first insulating layer and bit line pattern; depositing sequentially a third and fourth insulating layer which have different etch rates on the second insulating layer masking and etching said third and fourth insulating layers to form T-shaped insulating patterns in cross-sectional view, wherein the fourth insulating layer corresponds to a head portion of the T-shaped insulating pattern, and the third insulating layer corresponds to a leg portion of the T-shaped insulating pattern, wherein said T-shaped insulating patterns comprise one group forming bit line contacts and the other group forming storage node contacts; forming polysilicon spacers at sidewalls of the T-shaped insulating patterns; depositing a fifth insulating layer on the entire surface of the resultant structure including the T-shaped insulating layer patterns forming first photoresist mask patterns for forming bit line contact holes on said fifth insulating layer over T-shaped patterns of one group etching predetermined portions of said fifth insulating layer and T-shaped insulating layer pattern of one group according to said first photoresist mask pattern, etching predetermined portions of said second insulating layer using the polysilicon spacers an etch barrier, etching the bit line using the etched second insulating layer as a etch barrier and etching the first insulating layer using said bit line as a etch barrier, thereby forming bit line contact holes; depositing and patterning a conducting material on the entire surface of the fifth insulating layer including said bit line contact holes; depositing a sixth insulating layer on the entire surface of said fifth insulating layer and said conducting material pattern; forming a second photoresist mask with patterns for forming a storage node contact hole on said sixth insulating layer over T-shaped patterns of the other group; etching predetermined portions of said sixth and fifth insulating layers and T-shaped insulating layer patterns of the other group according to said second photoresist mask, predetermined portions of said second and first insulating layers using polysilicon spacers as an etch barrier, thereby forming storage node contact holes.

These and other objects, features and advantages of the present invention will become more apparent in light of the following detailed description of a best mode embodiment thereof, as illustrated in the accompanying drawing.

BEST MODE FOR CARRYING OUT THE INVENTION

The process of forming of contacts of bit line and storage node electrode, respectively in accordance with the present invention will be now be described with reference to FIGS. 4(A)–4(H) which represent a sectional view showing various stages of a fabrication process of DRAM cell according to one embodiment of the present invention and is sectioned along the X–X' line in FIG. 1.

Figure 4A:
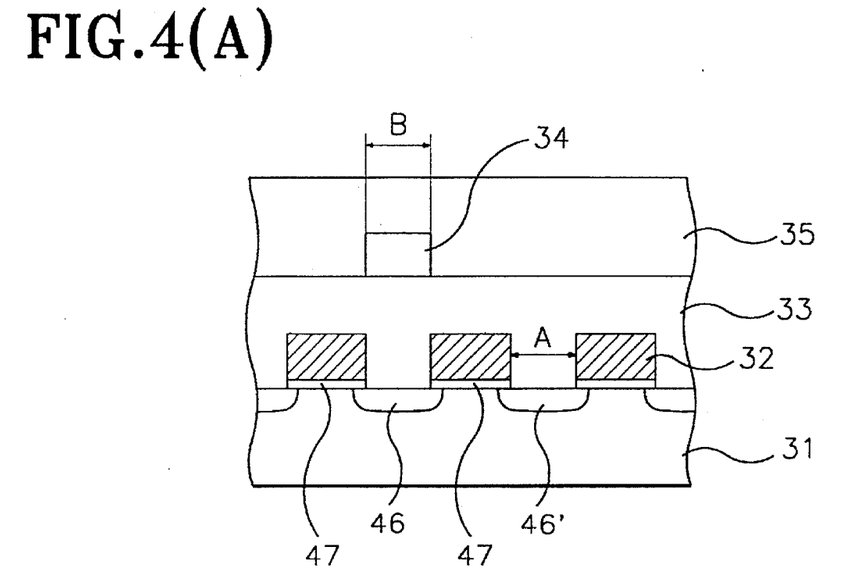
FIGS. 4A–4H are a sectional view showing a fabrication process of a DRAM cell according to the present invention and is sectioned along the X–X' line in FIG. 1.

First, referring to FIG. 4A, there is shown a bit line 34 formed on a first insulating layer 33, in which the first insulating layer 33 is to be formed on a MOS structure which comprises drain 46, source 46' region of diffusion layer in silicon substrate 31, gate oxide 47 of silicon dioxide and gate electrode 32 of polysilicon.

In formation of the MOS structure, the silicon dioxide layer, approximately 350 Angstroms thickness, is first thermally grown on a surface of the silicon substrate 31. The substrate 31 is subjected to thermal oxidation in a stream environment for approximately 7 minutes at a temperature of approximately 850° C. to form the silicon dioxide layer. The polysilicon layer is then deposited using chemical vapor deposition to a thickness of approximately 4,500 Angstroms on the silicon dioxide layer The polysilicon layer and the silicon dioxide layer are then patterned using common photolithographic techniques. The thus formed pattern of polysilicon and silicon dioxide are respectively denoted with reference numerals "32" and "47" in FIG. 4(A).

After the formation of the gate pattern, the exposed portions are then subjected to an ion implantation of p-type or n-type impurities and afterwards driven by thermal annealing. Through the ion implantation and thermal annealing, drain 46 and source 46' are formed in the silicon substrate.

A first insulating layer 33 is deposited on the MOS structure formed according to the above processes, which is to insulate one conductor layer from another and plays a role as well in planarizing the deposited surface.

Bit lines 34 of polysilicon are formed on the first insulating layer 33, orthogonal with the gate electrode of word line by a common process. As shown in FIG. 4A, the interval between a word line and a word line adjacent to it, is denoted as "A" and the width of bit line as "B".

The bit line of polysilicon can be substituted for a bit line of a silicide (compound of metal and silicon) or a double layer structure of polycide (compound of metal and polysilicon) and polysilicon in order to increase the conductivity.

The metal used for forming the silicide or the polycide mentioned above is to lower the contact resistivity and is selected from refractory metal group consisting of W, Ta, Ti, Mo, Pt, Pd, Ni, Co, etc.

A second insulating layer 35 is then deposited on the entire resultant surface including the bit line 34 and the first insulating layer 33, which insulates one conductor layer from another and plays a role in planarizing the deposited surface.

Figure 4B:
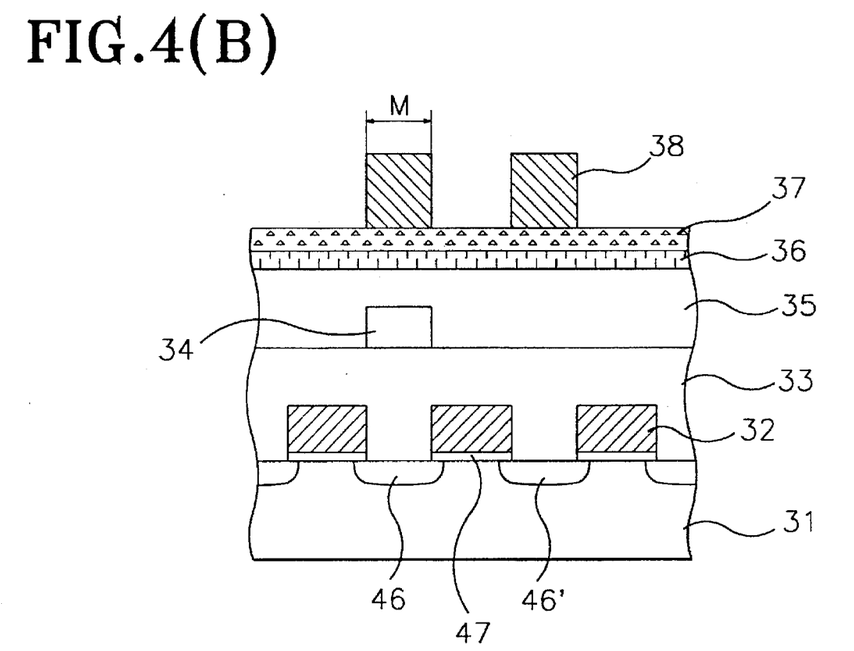

Next, a third insulating layer 36 and a fourth insulating layer 37 are sequentially deposited on the surface of the second insulating layer 35 as shown in FIG. 4B.

Here, the second, third and fourth insulating layers 35, 36 and 37, have a different etch rate from each other. In particular, the third insulating layer 36 has a higher etch rate than that of the fourth insulating layer 37. Following the fourth insulating layer 37 dposition, a resist layer is then deposited on the upper surface of the fourth insulating layer 37 and patterned to a predetermined size, in which the width of the resist mask pattern 38 is denoted as "M".

Figure 4C:
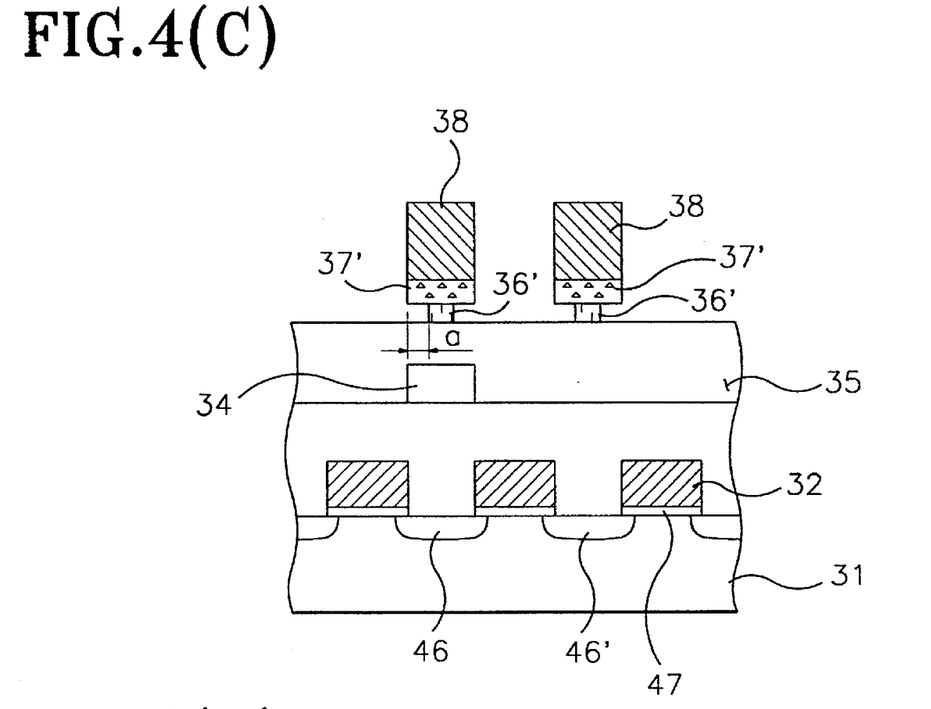

Next, as shown in FIG. 4C, using a mask pattern 38, the fourth insulating layer 37 and the third insulating layer 38 are selectively etched away by an anisotropic etch.

The difference of etch rate between the third insulating layer 36 and the fourth insulating layer 37 results in that a sidewall portion of the third insulating layer 36 is more removed by a definite width of "a" than the sidewall of the fourth insulating layer 37. Accordingly, the width of the etched third insulating layer 36 is M−2a. After said etch step is completed, T-shaped insulating layer pattern is obtained. A remaining fourth insulating layer is a head portion 37' of the T-shaped pattern. A remaining third insulating layer is a leg portion 36' of the T-shaped pattern.

Figure 4D:
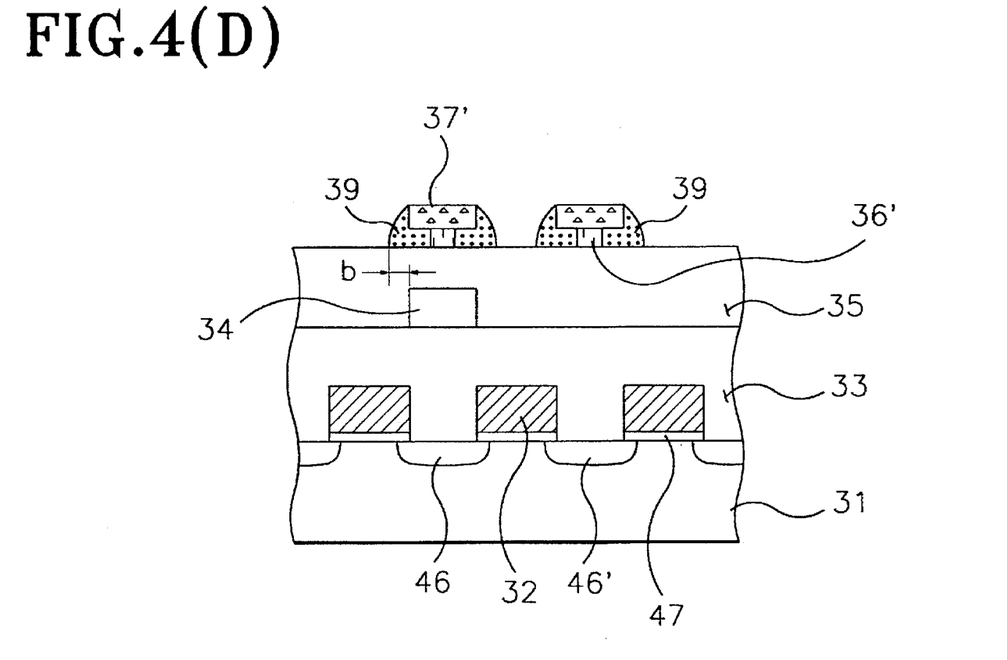

Next, as shown in FIG. 4D, the first mask pattern 38 shown in FIG. 4C is then removed. A third polysilicon is deposited on the exposed upper surface of the second insulating layer 35 and the exposed portions of the third insulating layer pattern 36' and the fourth layer pattern 37'.

Next, the third polysilicon is etched to eventually form a sidewall polysilicon spacer 39 by a blanket etch. After this etching step, width of the polysilicon spacer is longer than a head portion in the T-shaped pattern by "b" on one side. Therefore, total width of the polysilicon spacer becomes "M+2b".

In addition, the polysilicon spacer, can be alternately made from silicon nitride.

Figure 4E:
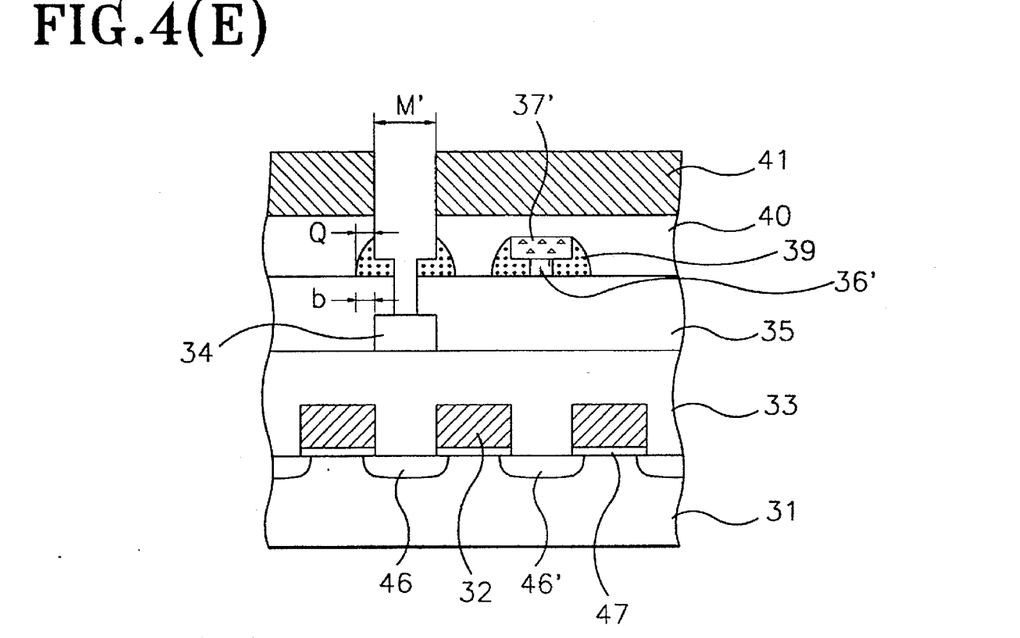

Following formation of the polysilicon spacer 39, on the entire surface of the resultant semiconductor structure is deposited a fifth insulating layer 40 to provide a planar surface, as shown in FIG. 4E. Using a second mask pattern 41, the fifth insulating layer 40, the fourth layer pattern 37', the third insulating layer pattern 36' and the second insulating layer 35 are sequentially etched away to provide contact hole extending to the surface of the bit line 35 by anisotropic etch, as shown in FIG. 4E. In this etching step, after removing the fifth insulating layer 40 and the fourth layer pattern 37', the third insulating layer pattern 36' and the underlying second insulating layer 35 are sequentially etched by using polysilicon spacer 39 as the etch stopper. As shown in FIG. 4E, if the opening width of the second mask pattern 41 is given as M', the width of the opening in the second mask pattern 41 may be changed in the range of M<M'≦M+2b because it must have a smaller width than that of sidewall polysilicon spacer 39. Accordingly, an alignment margin which is half of an interval between the width of the sidewall polysilicon spacer and the width of the second mask pattern M', occurs as wide as Q=(M+2b−M')/2.

Figure 4F:
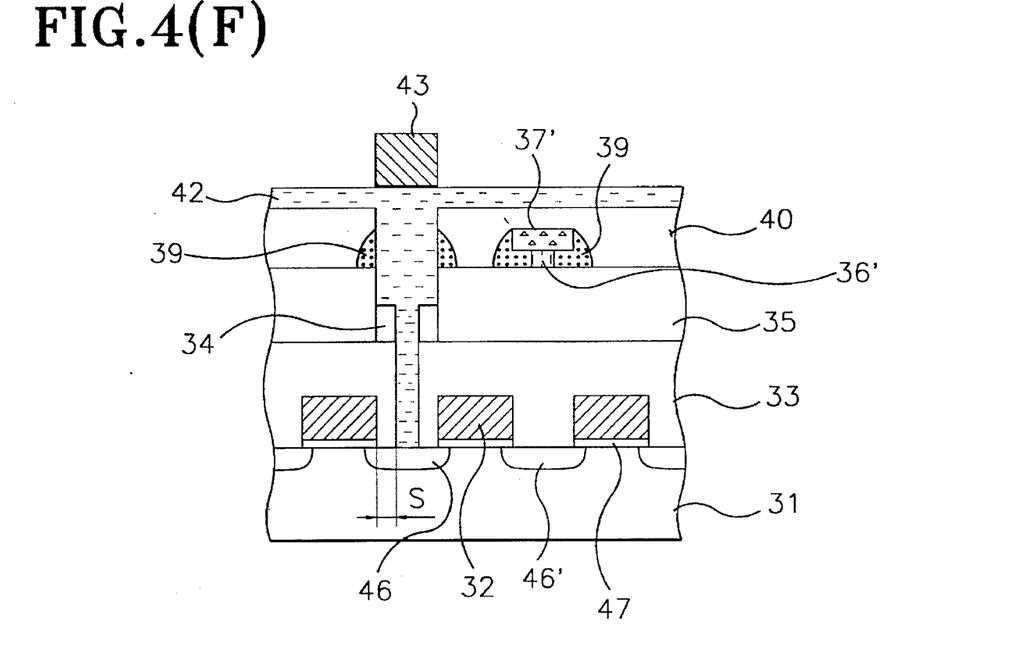

Referring to FIG. 4F, after removing the second mask pattern 41, the midway portion of the bit line 34 is etched away, using the second insulating layer pattern etched in previous step as a barrier against etch. Accordingly, the same pattern as the pattern of the second insulating layer 35 is formed in the middle of the bit line 34. Following the bit line 34 etching step, the first insulating layer 33 is selectively etched away anisotropically to provide a contact hole extending to the drain region 46, using the remaining bit line as the barrier against etch, as shown in FIG. 4F.

Next, the remaining lower internal portion of the polysilicon spacer or pad 39, and the remaining second insulating layer 35 are sequentially etched to form a widened contact hole extending to the upper portion of the bit line 34.

Figure 4G:
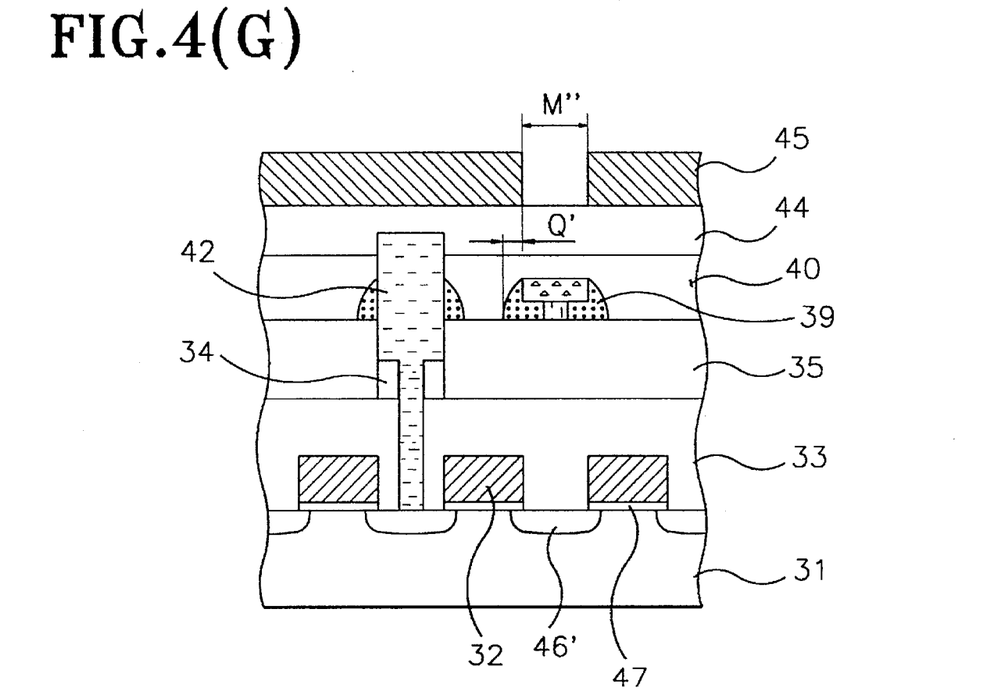

Next, a fourth polysilicon layer 42 is deposited to fill the contact hole and cover the upper portion of the fifth insulating layer 40, as shown in FIG. 4F. A third mask pattern 43 is formed to remove the fourth polysilicon layer 42 around the contact hole. Using the third mask pattern 43, the fourth polysilicon layer 42 around the contact is etched away. In this time, the final width of the bit line contact in contact with the drain, is M'−2a. Therefore, if the process margin of the interval between the final bit line contact and the word line adjacent thereto is denoted as "S", S becomes (A−M'+2a)/2. Additionally, the contact for the bit line being the fourth polysilicon layer deposited to fill the contact hole may also be formed, using the blanket etch without the use of the third mask pattern 43. Next, to form a contact hole of the storage node electrode, a sixth insulating layer 44 is deposited on the entire surface of the resultant structure. Following the sixth insulating layer 44 deposition, a photoresist 45 is deposited on the sixth insulating layer 44 and is then patterned to form an opening at a region for a storage node contact to be formed. As shown in FIG. 4G, in case that the width of a photoresist pattern 45 is given as the size M", there exists an alignment margin for the mask size as wide a the size, Q'=(M+2b=M')/2 between the polysilicon spacer 39 and the fourth mask pattern 45 as illustrated in the bit line contact.

Figure 4H:
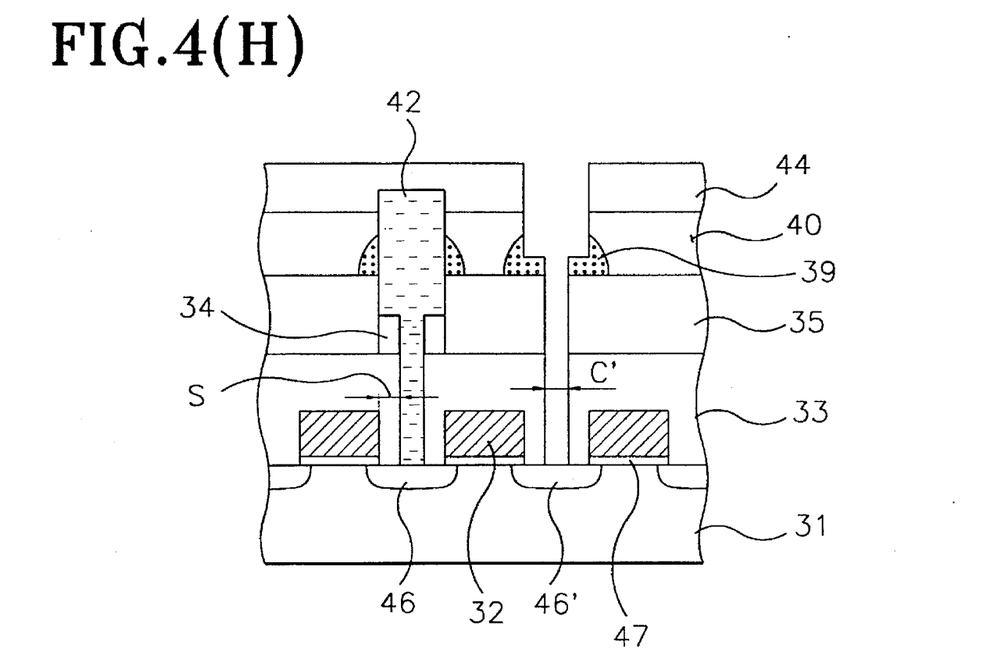

Referring to FIG. 4H, using the photoresist pattern 45, the sixth, fifth, fourth, third, second and first insulating layers 44, 40, 37', 36', 35 and 33 are sequentially etched. If more specifically described, the sixth, and fifth insulating layers 44, 40 are, at first, squentially etched away, using the fourth mask pattern 45. Following the etching of the sixth and fifth insulating layers 44, 40, the fourth and third insulating layers 37' and 36' inside the polysilicon spacer 39 are sequentially etched using the polysilicon spacer 39 as an etch barrier. Next, the second and first insulating layers 35 and 33 are etched using the etch pattern, i.e., the lower opening of the polysilicon spacer 39 form the contact hole extending to the source regions. At this time, the size of the contact hole which is finally formed is denoted as C', c' becomes M"−2a. Accordingly, the process margin which is the interval between the final storage contact hole and the gate electrode adjacent thereto, is denoted a S, S becomes (A−M"+2a)/2.

Figure 5:
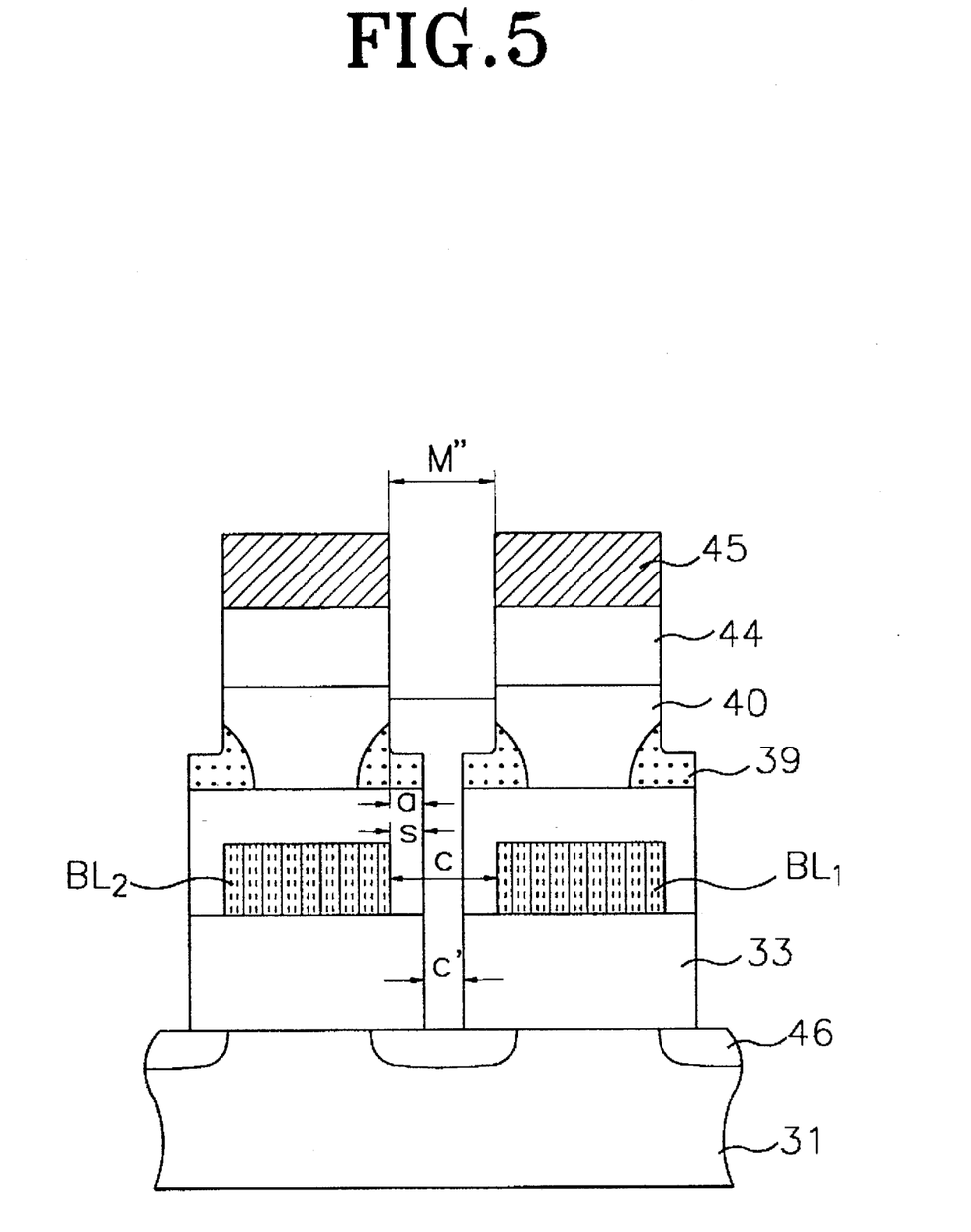
FIG. 5 is a sectional view of DRAM cell according to the present invention illustrated in FIG. 4 and is sectioned along the Y–Y' line of FIG. 1.

FIG. 5 is a cross-sectional view of DRAM cell fabricated by the process of FIGS. 4(A)−4(H), which is taken along Y−Y' line in FIG. 1.

As previously described, the difference in the width of the fourth insulating layer pattern 37' and the third insulating layer pattern 36' is denoted as "a" in FIG. 4C, the interval between adjacent bit lines is denoted as "C" in FIG. 1 and the width of the formed storage node contact is denoted as C' in FIG. 4H, so that C' becomes M"−2a. Accordingly, in case that the process margin in the storage node contact is denoted as "S'", "S'" becomes C−(M"−2a)=C−M"+2a. This result obviously shows that the present invention can secure an alignment margin of S' in comparison with the conventional art.

Here, to compare the present process with the conventional one, we again consider FIG. 3 which is formed according to the process of FIGS. 2A−2G and is taken along Y−Y' line in FIG 1.

Comparing this process with the one of the present invention, the conventional process is that the polysilicon pad 9 is firstly formed and the bit line is formed in the future whereas the present process is that the bit line is firstly formed and the pad is formed in the future. We know that the conventional process can not secure the alignment margin between the storage node contact and bit line adjacent thereto from the above fact.

As apparent from the above description, the present invention provides a process of forming storage node contact without the problem of shorting between the storage node contact and the adjacent bit lines. This process is characterized by first forming the bit lines in comparison with the polysilicon pad having the contact hole pattern which consists of two insulating layers having different etch rate inside. Therefore, the process of the present invention provides advantages of preventing the problem of shorting due to the increase of the integration by securing the alignment margin for the storage node contact with the bit lines without development of new semiconductor equipment so that it can decrease the cost invested by increasing the integration of semiconductor devices. Accordingly, it makes it possible to fabricate ULSI semiconductor devices over 256 Megabit DRAM with ease.

Although the preferred embodiment of the invention has been disclosed for illustrative purposes, those skilled in the art will appreciate that various modifications, additions and substitutions are possible without departing from the scope and spirit of the invention as disclosed in the accompanying claims.

What is claimed is:

1. A method of manufacturing a semiconductor device comprising the steps of:

depositing a first insulating layer on a semiconductor substrate having active electrodes of source, drain and gate;

forming a conductive layer pattern to provide a bit line pattern on said first insulating layer;

depositing a second insulating layer that completely covers said first insulating layer and bit line pattern;

depositing sequentially a third insulating layer and a fourth insulating layer which have different etch rates on the second insulating layer;

masking and etching said fourth and third insulating layers to form T-shaped patterns in cross-sectional view, wherein the fourth insulating layer corresponds to a head portion of the T-shaped pattern, and the third insulating layer corresponds to a leg portion of the T-shaped pattern, wherein one of said T-shaped, patterns forms a bit line contact and another one of said T-shaped patterns forms a storage node contact;

forming polysilicon spacers at a sidewall of the T-shaped patterns;

depositing a fifth insulating layer on an entire surface of a resultant structure including the T-shaped patterns;

forming first photoresist mask patterns for forming bit line contact holes on said fifth insulating layer over said one of said T-shaped patterns;

etching portions of said fifth insulating layer and said one of said T-shaped insulating layer pattern using said first photoresist mask, etching a portion of said second insulating layer by using a polysilicon spacer as an etch barrier, etching the bit line pattern using the etched second insulating layer as an etch barrier and etching the first insulating layer using said bit line as an etch barrier, thereby forming a bit line contact hole;

depositing and patterning a conducting material on an entire surface of the fifth insulating layer including said bit line contact hole;

depositing a sixth insulating layer on an entire surface of said fifth insulating layer and said conducting material pattern;

forming a second photoresist mask pattern for forming a storage node contact hole on said sixth insulating layer over said another one of said T-shaped patterns;

etching portions of said sixth and fifth insulating layers and T-shaped pattern using said second photoresist mask, etching portions of said second insulating layer and said first insulating layer using said polysilicon spacer which acts as an etch barrier, thereby forming a storage node contact hole.

2. The method according to claim 1, wherein said bit line is polysilicon.

3. The method according to claim 1, wherein said bit line is silicide.

4. The method according to claim 1, wherein said bit line has a double structure of polycide and polysilicon.

5. The method according to claim 3, wherein said silicide is made from refractory metal.

6. The method according to claim 4, wherein said polycide is made from refractory metal.

7. The method according to claim 1, wherein said depositing and patterning step of said conducting material is replaced by a step of etching the deposited conducting material by a blanket etch process.

8. The method according to claim 1, wherein said third insulating layer has a higher etch rate than said fourth insulating layer.

9. The method according to claim 1, wherein silicon nitride is used instead of polysilicon for said polysilicon spacers.

10. The method according to claim 1, wherein a width of an opening in said first photoresist mask pattern has a range of $M<M'\leq M+2b$, where M is a width of the head in said one of said T-shaped patterns, M' is said width of said opening in said first photoresist mask pattern for forming a bit line contact hole, and M+2b is a width of a polysilicon spacer portion in contact with the second insulating layer.

11. The method according to claim 1, wherein a width of an opening is said second photoresist mask pattern has a range of $M<M''\leq M+2b$, where M is a width of the head in said another one of said T-shaped patterns for forming a storage node contact hole, M'' is the width of the second photoresist mask pattern, and M+2b is a width of a polysilicon spacer portion in contact with the second insulating layer.

* * * * *

UNITED STATES PATENT AND TRADEMARK OFFICE
CERTIFICATE OF CORRECTION

PATENT NO. : 5,627,095
DATED : May 6, 1997
INVENTOR(S) : Koh et al

It is certified that error appears in the above-indentified patent and that said Letters Patent is hereby corrected as shown below:

At column 5, at line 6, please insert --.-- after "layer"; and at line 49, please cancel "dposition" and substitute --deposition-- therefor.

At column 7, line 3, please cancel "a the size, Q'=(M+2b=M')/2" and substitute therefor --as the size, Q'=(M+2b=M")/2--;

at line 8, please insert --,-- after "35"; and at line 17, please insert --so as to-- after "39".

Signed and Sealed this

Ninth Day of December, 1997

Attest:

Attesting Officer

BRUCE LEHMAN

Commissioner of Patents and Trademarks